United States Patent [19]

Takagi et al.

[11] 3,951,729

[45] Apr. 20, 1976

[54] METHOD FOR PRODUCING SINGLE CRYSTALS

[75] Inventors: Kazumasa Takagi, Kokubunji; Tokuumi Fukazawa, Tachikawa; Mitsuru Ishii, Higashiyamato; Seigo Kishino, Hachioji, all of Japan

[73] Assignee: Hitachi, Ltd., Japan

[22] Filed: Jan. 11, 1974

[21] Appl. No.: 432,516

[30] Foreign Application Priority Data
Jan. 16, 1973 Japan.................................. 48-6644

[52] U.S. Cl. ............................ 156/617; 23/301 SP; 23/273 SP; 423/263
[51] Int. Cl.² ........................................ B01J 17/18
[58] Field of Search ................... 23/301 SP, 273 SP; 423/263; 156/617

[56] References Cited
UNITED STATES PATENTS
3,723,599   3/1973   Brandle, Jr. et al. ................ 423/263
3,761,692   9/1973   Cope .......................... 23/273 SP X

OTHER PUBLICATIONS

Goss et al.; Semiconductors Part 1, I, Solid state Physics in Electronics and Telecommunication, pp. 30–31, 1960.

Primary Examiner—James H. Tayman, Jr.
Attorney, Agent, or Firm—Craig & Antonelli

[57] ABSTRACT

In growing single crystals of gadolinium gallium garnet, dysprosium gallium garnet and the like according to the Czochralski method, when the velocity of rotation of the crystal during growth of a slender part is made lower than the velocity of rotation of the crystal during growth of a body portion, single crystals free of defects such as dislocation or facet can be obtained.

16 Claims, 4 Drawing Figures

METHOD FOR PRODUCING SINGLE CRYSTALS

BACKGROUND OF THE INVENTION

1. Field of the Invention

This invention relates to a method for producing single crystals by Czochralski method. More particularly, the invention relates to a method for producing single crystals free of defects such as dislocation or facet.

2. Brief Description of the Prior Art

When it is intended to grow a single crystal of good quality by the Czochralski method, a seed crystal is contacted with a melt and then the seed crystal is pulled up while rotating it to form a part of a relatively small diameter. For example, when a crystal of Si is grown, the length of this small diameter part (hereinafter referred to as a "slender part") is generally 7 to 10 times the diameter of the seed crystal. After formation of its slender part, the diameter of the crystal is gradually increased and then the diameter is made constant to grow a single crystal of a large diameter free of a dislocation defect as a body portion. Either dislocation present in the seed crystal or dislocation introduced at the time of seeding can be taken out in the surface and removed therefrom by forming the above-mentioned slender part.

In conventional methods for growing single crystals according to the Czochralski method, the velocity of rotation of the crystal is not changed during the growing step, and the velocity is maintained at a constant level so that a facet which is a defect owing to the habit of the crystal is not formed. Since a facet is formed because of the presence of a habit plane having a certain angle to the crystal pulling-up axis, removal of the facet can be accomplished by leveling the convex form of the solid-liquid interface on the melt side and keeping the interface substantially vertically to the pulling-up axis. The form of the liquid-solid interface varies depending on the velocity of rotation of the crystal, and at a lower rotation velocity the form of the interface on the melt side is more convex. Accordingly, the above condition is satisfied by heightening the rotation velocity to such an extent that the interface form is not too concave and thus the facet is removed.

In removing a dislocation caused by growth of the slender part, no particular problem is brought about on the form of the solid-liquid interface in conventional methods, and the object of removal of said dislocation can easily be attained. More specifically, the crystal plane in which a dislocation is formed is usually at (111), and therefore, all the dislocation is removed to the surface by choosing the pulling-up axis suitably.

However, as a result of our research efforts, it has been found that it is true in all crystals that dislocation defects of the slender part can be removed regardless of the form of the solid-liquid interface. For instance, in growing a single crystal of gadolinium gallium garnet ($Gd_3Ga_5O_{12}$ which will be referred to as "GGG" hereinafter) to be used as a substrate of a bubble device now highlighted as a memory element for an electronic computor, when the conventional techniques of the Czochralski method are directly applied, it is very difficult to obtain a single crystal of good quality. More specifically, if a slender part is formed at such a crystal rotation velocity as will form no facet, removal of the dislocation is very difficult, and if it is intended to remove the dislocation by all means under the above rotation velocity condition, it is necessary to increase the length of the slender part extremely, with the result that it takes a long time to complete the preparation of the intended single crystal and the amount of Ga evaporated during formation of the slender part is so large that there is brought about such a great defect that the composition of the resulting single crystal is greatly deviated from the intended composition.

If a facet is generated, distortion occurs at this portion, and further, if other element is doped, segregation is caused to occur. Accordingly, in order to obtain a single crystal of good quality, it is necessary to avoid not only dislocation but also facet defects. In case GGG or the like is used as a substrate of a bubble device, defects such as dislocation and such as facet result in trapping of a bubble domain and hence, the presence of such defects is not permissible.

SUMMARY OF THE INVENTION

It is a primary object of this invention to provide a method for producing single crystals according to which defects involved in the conventional techniques can be overcome and single crystals of good quality free of dislocation or facet can be obtained even from materials from which single crystals of good quality are hardly obtained according to conventional procedures of the Czochralski method, such as GGG. In this invention, the above object can be attained by conducting the Czochralski method in such a manner that the velocity of rotation of the crystal during growth of a slender part is lower than the velocity of rotation of the crystal after formation of the slender part.

As pointed out above, it has been found that according to the conventional techniques of the Czochralski method, it is very difficult to remove dislocation defects in growing single crystals of GGG and the like. As a result of detailed examinations made on the reason, it was found that GGG or the like dislocation tends to grow vertically with respect to the solid-liquid interface and hence, when the interface resembles a plane face, the dislocation extends in the axial direction and is hardly drawn out into the surface. Accordingly, it was found that in order to draw out and remove such dislocation into the surface, the direction of growth of the dislocation should be deviated from the axial direction and that in order to attain this deviation, the form of the solid-liquid interface should be made convex on the melt side.

Based on the foregoing novel findings, in the method of this invention for producing single crystals, growing of single crystals is conducted so that the form of the solid-liquid interface is made convex on the melt side during growth of a slender part and that during growth of an intended single crystal proper having a large diameter (hereinafter referred to as "body portion") the solid-liquid interface is made substantially level. It is in order to prevent occurrence of facet defects that the solid-liquid interface is made substantially level during growth of the body portion. Since dislocation has already been distinguished at the step of growing the body portion, it is unnecessary to make the solid-liquid interface convex at this setp. As pointed out above, in order to attain such feature it is sufficient to lower the velocity of rotation of the crystal during growth of the slender part and heighten the velocity of rotation of the crystal during growth of the body portion.

It is known that the form of the solid-liquid interface is generally determined by the temperature distribution during the step of growing a crystal, the velocity of rotation of the crystal and the diameter of the crystal. When a crystal is grown at a low rotation velocity, the melt causes a rising movement in the vicinity of a wall portion of a crucible where a high temperature is maintained. In contrast, since the temperature is relatively low in the vicinity of the central portion of the crystal, the melt causes a falling movement at such area. Accordingly, there is formed a convectional movement of the melt. However, if the velocity of rotation of the crystal is heightened, the direction of the convectional movement of the melt in the vicinity of the central portion is reversed and on the melt side the form of the solid-liquid interface is changed from a convex face to a plane face, and when the rotation velocity is further increased, the form of the liquid-solid interface becomes concave on the melt side. Accordingly, in order to obtain a single crystal of good quality free of such defects as dislocation and facet, it is sufficient that at the initial stage of growth of the crystal, namely during growth of a slender part, the velocity of rotation is maintained at a low level to thereby make the form of the solid-liquid interface convex on the melt side and to remove dislocation and then the rotation velocity is gradually heightened and maintained at a relatively high level during growth of a body portion to make the solid-liquid interface substantially plane and to prevent formation of facet defects.

The form of the solid-liquid interface can be defined by the formula H/D in which D is a diameter of crystal and H is a height of the curved portion forming the interface. The value of H is expressed by a positive number when the form of the interface is convex on the melt side, and the value of H is expressed by a negative number when the form of the interface is concave on the melt side. Accordingly, $H/D>0$, $H/D=0$ and $H/D<0$ indicate the case where the interface is convex on the melt side, the case where the interface is plane or level and the case where the interface is concave on the melt side, respectively.

In the method for producing single crystals according to this invention, it is desired that the velocity of rotation of the crystal is so adjusted that the value H/D is from about 0.2 to about 0.7 during growth of the slender part and from about −0.05 to about 0.1 during growth of the body portion. Incidentally, only when the velocity of rotation of the crystal during growth of the slender part is lower than the velocity of rotation of the crystal during growth of the body portion, can results be obtained that are better than those attainable according to conventional techniques. In case the H/D value is less than about 0.2 during growth of the slender part, it is necessary to prolong the length of the slender part for removing dislocation defects, because the form of the solid-liquid interface approaches a plane face. As a result, the manufacturing time should be prolonged and the amounts of crystal-constituting elements such as Ga evaporated are so increased that the composition of the obtained crystal is deviated from the intended composition. Accordingly, such a low H/D value, i.e. less than 0.2, is not acceptable during the step of forming the slender part.

In case GGG is prepared according to the conventional techniques of the Czochralski method, the diameter of a slender part is usually 5 to 8mm and the pulling-up rate is about 6mm/hr. Assuming that the dislocation concentration is $10^3$ to $10^4$ per square centimeter at the initial stage of the pulling-up step, if growth of the crystal is conducted under these conditions while maintaining the H/D value at about 0.2, the length of the slender part necessary for removal of dislocation defects is about 4 to about 5 times the diameter of the slender part, and formation of a crystal of good quality cannot be expected. In order to obtain a crystal of good quality, according to our experimental experiences, it is desired that the time for formation of the slender part is adjusted within about 2.5 to about 3 hours.

In case the H/D value is greater than 0.7 during growth of the slender part, the solid-liquid interface is too convex on the melt side. In order to attain such form in the solid-liquid interface, it is necessary to establish too great a temperature gradient, and it is practically impossible to maintain the H/D value at a level exceeding 0.7. Furthermore, in order to establish such a great temperature gradient, it is necessary to heighten considerably the temperature of the melt in the vicinity of the wall of a crucible, which results in such disadvantages as increase of evaporation of the crystal-constituting elements such as Ga.

In case the H/D value is smaller than −0.05 during growth of the body portion, the solid-liquid interface is considerably concave on the melt side, and voids are readily formed in the central portion and the growth state becomes unstable. In case the H/D value exceeds 0.1 during growth of the body portion, levelness is lost from the interface and facet defect is expanded. Therefore, such a too small or too large a value of H/D is not acceptable according to the invention.

It is especially preferred in this invention that the H/D value is from about 0.3 to about 0.6 during growth of the slender part, and most preferred results are obtained when the H/D value is about 0.4 to about 0.5 during growth of the slender part.

DESCRIPTION OF PREFERRED EMBODIMENTS

Figure 1:
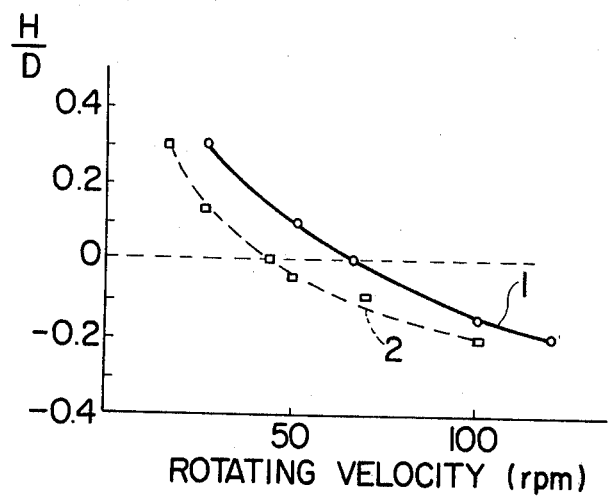
FIG. 1 is a diagram illustrating the relation between the form of the solid-liquid interface and the velocity of rotation of the crystal in the embodiments of this invention.

The method of this invention for produding single crystals will be more apparent from Examples which follow.

EXAMPLE 1

This Example illustrated an embodiment where a single crystal of GGG, namely gadolinium gallium garnet ($Gd_3Ga_5O_{12}$) is produced.

A single crystal having a diameter of 18 to 20mm was grown with use of an iridium crucible having a diameter of 40mm. The temperatures of the surface of the melt was about 1680°C. at the central portion and about 1760°C. at the circumferential position and the pulling-up rate was about 6mm/hr. The relation between the form of the solid-liquid interface and the velocity of rotation of the crystal is shown in Curve 1 of FIG. 1. The interface form is defined by the formula H/D in which D is a diameter of the crystal and H is a height of a curved portion forming the interface. The H value is expressed by a positive number when the interface form is convex on the melt side and is expressed by a negative number when the interface form is concave on the melt side. FIG. 2a illustrates a specific example of the form of the interface in the former case, and FIG. 2b illustrates a specific example of the form of the interface in the latter case. In FIGS. 2a and 2b, reference numerals 3 and 4 indicate a crystal and a melt, respectively.

Figure 2A:
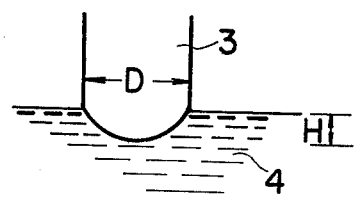
FIG. 2a and FIG. 2b are diagrams illustrating the cross-sectional form of the solid-liquid interface observed when a single crystal is prepared according to the Czochralski method.
Figure 2B:
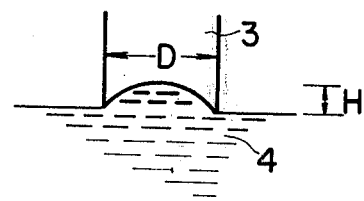

As is seen from Curve 1 of FIG. 1, when the rotation velocity exceeded 70 rpm, the H/D value was negative and the form of the solid-liquid interface was concave on the melt side. On the other hand, when the rotation velocity was lower than 70 rpm, the H/D value was positive, and the form of the solid-liquid interface was convex on the melt side.

Figure 3:
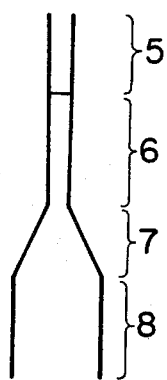
FIG. 3 is a diagram illustrating the form of a single crystal being grown according to the Czochralski method.

With reference to FIG. 3, just after seeding, a seed crystal 5 was rotated at a rotation velocity of 27 rpm, and a slender part 6 was grown by pulling up the seed crystal 5 at said rotation velocity and at said pulling-up rate of about 6 mm/hr. until the slender part had a length about 3 times the diameter of the seed crystal 5, whereby the dislocation defect was removed. Then, the diameter was gradually increased at an angle of about 60° to form a shoulder portion 7, and a body portion 8 of a diameter of 18 to 20 mm was grown. During the stage of growth of the body portion 8, the velocity of rotation of the crystal was gradually increased to 70 rpm to thereby make the solid-liquid interface substantially plane and remove possible facet defects. Thus, was obtained a single crystal of GGG free of either dislocation or facet defects.

EXAMPLE 2

This Example illustrates an embodiment where a single crystal of dysprosium gallium garnet ($Dy_3Ga_5O_{12}$) is produced. In this example, the temperatures of the surface of the melt were about 1730°C. at the central portion and about 1810°C. at the circumferential portion, and the pulling-up rate was about 6 mm/hr.

The dependency of the form of the solid-liquid interface for dysprosium gallium garnet on the velocity of rotation of the crystal is shown in Curve 2 of FIG. 1. As is seen from Curve 2, the solid-liquid interface became level at a lower rotation velocity than in the case of gadolinium gallium garnet in Example 1. Also, in the case of dysprosium gallium garnet, growth of a slender part was conducted at a rotation velocity of 17 rpm so that the H/D value was substantially the same as in Example 1. During growth of a body portion, the rotation velocity was gradually increased to 45 rpm. As a result, a single crystal free of either dislocation or facet defects was obtained.

In growing single crystals by the Czochralski method, according to this invention, the velocity of rotation of the crystal during growth of a slender part is made lower than the velocity of rotation of the crystal after formation of the slender part, whereby a single crystal of good quality free of a dislocation defect or a facet defect can be obtained.

Further, needless to say, the method of this invention can be applied to not only the above-mentioned gadolinium gallium garnet and dysprosium gallium garnet but also all of the materials in which the dislocation defect tends to grow vertically with respect to the solid-liquid interface. An example of the production of such crystals is as follows:

EXAMPLE 3

A single crystal of yttrium aluminum garnet ($Y_3Al_5O_{12}$) having no dislocation defect or no facet defect was also grown by the method of this invention. In the case of this material, growth of a slender part was conducted at a rotation velocity of about 70 rpm, but during growth of a shoulder part and a body portion, the rotation velocity was gradually increased to approximately 125 rpm. The temperatures of the surface of the melt were about 1930°C. at the central portion and about 1980°C. at the circumferential portion, and the pulling-up rate was about 3 mm/hr.

It will be recognized from the above examples, that suitable temperatures of the surface of the melt are the melting point of the material at the central portion and that the temperature is about 50° to 80°C. higher at the circumferential portion than at central portion. If this temperature difference between the central portion and the circumferential portion is too little, the control of the diameter of the crystal will be difficult. Further, if this temperature difference is too large, the loss of Ga will increase.

It will also be appreciated that the suitable range for the pulling-up rate is 3 to 12 mm/hr., but the rate depends on the dimension of the crystal. In the case of the crystal diameter of greater than 25 mm, a pulling-up rate of about 3 mm/hr. is suitable. Generally, if this rate is less than 3 mm/hr., the time required to grow the crystal will be too long. Furthermore, if this rate is greater than 12 mm/hr., the probability of introduction of the dislocation defect will increase.

Also, it will be understood that in the foregoing examples, the pulling-up rate was constant. However, generally it is necessary in the case of a larger crystal diameter to grow it at a lower pulling-up rate. For example, the desirable pulling-up rate is about 6 mm/hr. during growth of a slender part, and then the rate is gradually decreased during growth of a shoulder part to about 4 mm/hr. at a body portion. If the pulling-up rate is as low during formation of a slender part as a body portion, the loss of Ga and the required time for growth will increase. However, when the pulling-up rate is varied, the relation between rotating velocity and H/D becomes different.

A suitable diameter of the seed crystal is 5 to 6 mm. If the seed crystal diameter is smaller than 4 mm, the average temperature of the melt will become higher, the loss of Ga will increase and detrimental inclusions will be generated. On the contrary, if the seed crystal diameter is as large as 10 mm, a large amount of the melt will be necessary to remove the dislocation defects. It will also be appreciated that, in general, the maximum diameter of the resulting crystal is approximately a half of the crucible diameter.

In summary, it will be understood that in the prior methods, dislocation defects or facet defects are retained in the body portion of the crystal. In contrast, in the method of this invention, these defects are not retained at all.

The dislocations of GGG and dysprosium gallium garnet have the Burger's vector of <111> or <100> and the slip plane of (110). However, the edge dislocation and the screw dislocation both have a tendency to grow vertically with respect to the solid-liquid interface and it is difficult that these dislocations exist at a specifically defined slip plane. For this reason, single crystals free of dislocation defect can be obtained in the method of this invention.

Further, the facet defects of GGG and dysprosium gallium garnet crystals occur at (211) and (110) planes. So, when the direction of pulling-up of the crystal is <111> and the solid-liquid interface is made substantially level, the crystal planes of (211) and (110) are parallel to the pulling axis to appear on the surface of the crystal, and the crystal tends to have a sectional shape of a triangle or a sexangle. This shape does not introduce any trouble for the application as a device, because the crystal is cut in a slice perpendicular to the pulling axis <111> and the surface of the (111) plane is used.

While the novel principles of the invention have been described, it will be understood that various omissions, modifications and changes in these principles may be made by one skilled in the art without departing from the spirit and scope of the invention.

What we claim is:

1. A process for producing a single crystal body free of facets and dislocations by the Czochralski method from a material in which dislocation defects grow perpendicularly with respect to the solid-liquid interface during a Czochralski growing method regardless of the pull-up axis, said process comprising producing by the Czochralski method a single crystal having a slender portion and said single crystal body attached to said slender portion, said slender portion being formed first followed by the formation of said single crystal body attached thereto, said single crystal being rotated during formation of said slender portion at a rate such that H/D is about 0.2 to about 0.7, said single crystal thereafter being rotated during formation of said single crystal body at a rate such that H/D is about −0.05 to about 0.1, wherein D is the diameter of the growing crystal and H is the distance by which the center of the solid-liquid interface is below the level of the melt, said slender portion being grown sufficiently long so that dislocations in said slender portion extend to the side surfaces of said slender portion whereby the part of the slender portion attached to said single crystal body is free of dislocations.

2. A method according to claim 1, wherein said velocity of rotation during growth of said slender part is so regulated that the value of H/D ranges from about 0.3 to about 0.6.

3. A method according to claim 1, wherein said velocity of rotation during growth of the slender part is so regulated that the value of H/D ranges from about 0.4 to about 0.5.

4. A method according to claim 1, wherein said crystal is composed of a substance selected from the group consisting of gadolinium gallium garnet, dysprosium gallium garnet and yttrium aluminum garnet.

5. A method according to claim 2, wherein said crystal is composed of a substance selected from the group consisting of gadolinium gallium garnet, dysprosium gallium garnet and yttrium aluminum garnet.

6. A method according to claim 3, wherein said crystal is composed of a substance selected from the group consisting of gadolinium gallium garnet, dysprosium gallium garnet and yttrium aluminum garnet.

7. The process of claim 1, wherein the rate of rotation during growth of said slender portion is such that H/D is about 0.3 to 0.6.

8. The process of claim 1, wherein the rate of rotation during growth of said slender portion is such that H/D is about 0.4 to about 0.5.

9. The process of claim 1, wherein said material is selected from the group consisting of a gadolinium gallium garnet, dysprosium gallium garnet and yttrium aluminum garnet.

10. The process of claim 1, wherein the difference between the surface temperature of the melt at the center of the melt and the circumference of the melt is about 50° to 80°C.

11. The process of claim 10, wherein the single crystal is pulled up from the melt at a pulling rate of about 3 to 12 mm/hr.

12. The process of claim 11, wherein the pull-up rate is constant during formation of said single crystal.

13. The process of claim 11, wherein the pull-up rate during formation of said slender portion is different from the pull-up rate during formation of said single crystal body.

14. The process of claim 11, wherein said slender portion is attached to the seed crystal.

15. The process of claim 14, wherein said seed crystal has a diameter of about 4 to 10 mm.

16. The process of claim 15, wherein said seed crystal has a diameter of 5 to 6 mm.

* * * * *